United States Patent [19]
Meier et al.

[11] Patent Number: 5,174,204
[45] Date of Patent: Dec. 29, 1992

[54] METHOD OF PRODUCING DECORATIVE DESIGNS AND ARTICLES PRODUCED THEREBY

[75] Inventors: Bradley I. Meier; Brian S. Turtletaub, both of North Miami Beach, Fla.

[73] Assignee: Universal Heights, Inc., Hollywood, Fla.

[21] Appl. No.: 830,391

[22] Filed: Dec. 29, 1992

[51] Int. Cl.⁵ .................... B41M 1/12; B05D 1/32
[52] U.S. Cl. .................... 101/129; 40/615; 427/282
[58] Field of Search ............ 101/129; 427/261, 265, 427/282; 40/615

[56] References Cited

U.S. PATENT DOCUMENTS 4,903,592  2/1990  Ericsson ..................... 101/115
4,930,413  6/1990  Jaffa ........................ 101/12 T

OTHER PUBLICATIONS

UV Curing Systems, Brewer; Paper Converting Convention, Wash. D.C., Sep. 30, 1987.

*Primary Examiner*—Edgar S. Burr
*Assistant Examiner*—Lynn D. Hendrickson
*Attorney, Agent, or Firm*—Weil, Gotshal & Manges

[57] ABSTRACT

This invention relates to a new type of decorative design and the method of producing said design. The process includes making an illustration of a picture or photograph, scanning said illustration while deleting part of the illustration, silk screening said scanned illustration with ultra-ink onto a substrate, and then cutting said substrate into a chosen article. The resulting article has a large part of the substrate without any ink on it, so as to give the design a three-dimensional look.

4 Claims, 1 Drawing Sheet

METHOD OF PRODUCING DECORATIVE DESIGNS AND ARTICLES PRODUCED THEREBY

BACKGROUND OF THE INVENTION

This invention relates to a new type of article having a decorative design and the method of its production. The design is produced by the use of a special screen printing process on a suitable substrate in which ultraviolet ("UV") ink is applied to the substrate while leaving large portions of the substrate blank. The method provides a three dimensional effect to the image printed on the substrate.

It was known previously in the printing art that UV inks could be used in off-set printing to produce an image on a substrate from photographs. However, this type of process prints the image over the entire surface of the substrate. Additionally, photographs could not readily be used in screen printing because most of the clarity of the original photograph would be lost as the substrate moved through four different screen printers for the printing of each of the four colors necessary to make a full color image. Moreover, if, during the printing process, the colors of a photograph are separated into the four primary colors of printing without any additional steps, stencils will be made so that the entire surface of the substrate would be covered by the image rendering a flat, two-dimensional appearance to the product.

SUMMARY OF THE INVENTION

The present invention provides a method for creating a design on a substrate, resulting in an article of design having a three-dimensional appearance. The method involves first photographing or obtaining a picture of the design subject, e.g., a football player or other sports figure or actor, etc., then preparing an illustration made from the photograph or picture that will be used to prepare the design on the substrate. The printing process also involves a modification of a four color separation process wherein the illustration, rather than the photograph or other picture, is used as the basis for the color separation. The invention thus provides a decorative design from a picture on a substrate, such that the design does not cover the entire surface of the substrate. The effect rendered is a three dimensional look to the design.

BRIEF DESCRIPTION TO THE DRAWING

FIG. 1 is a flow chart summarizing the steps in the process of making three-dimensional appearing images.

DETAILED DESCRIPTION OF THE INVENTION

Figure 1:
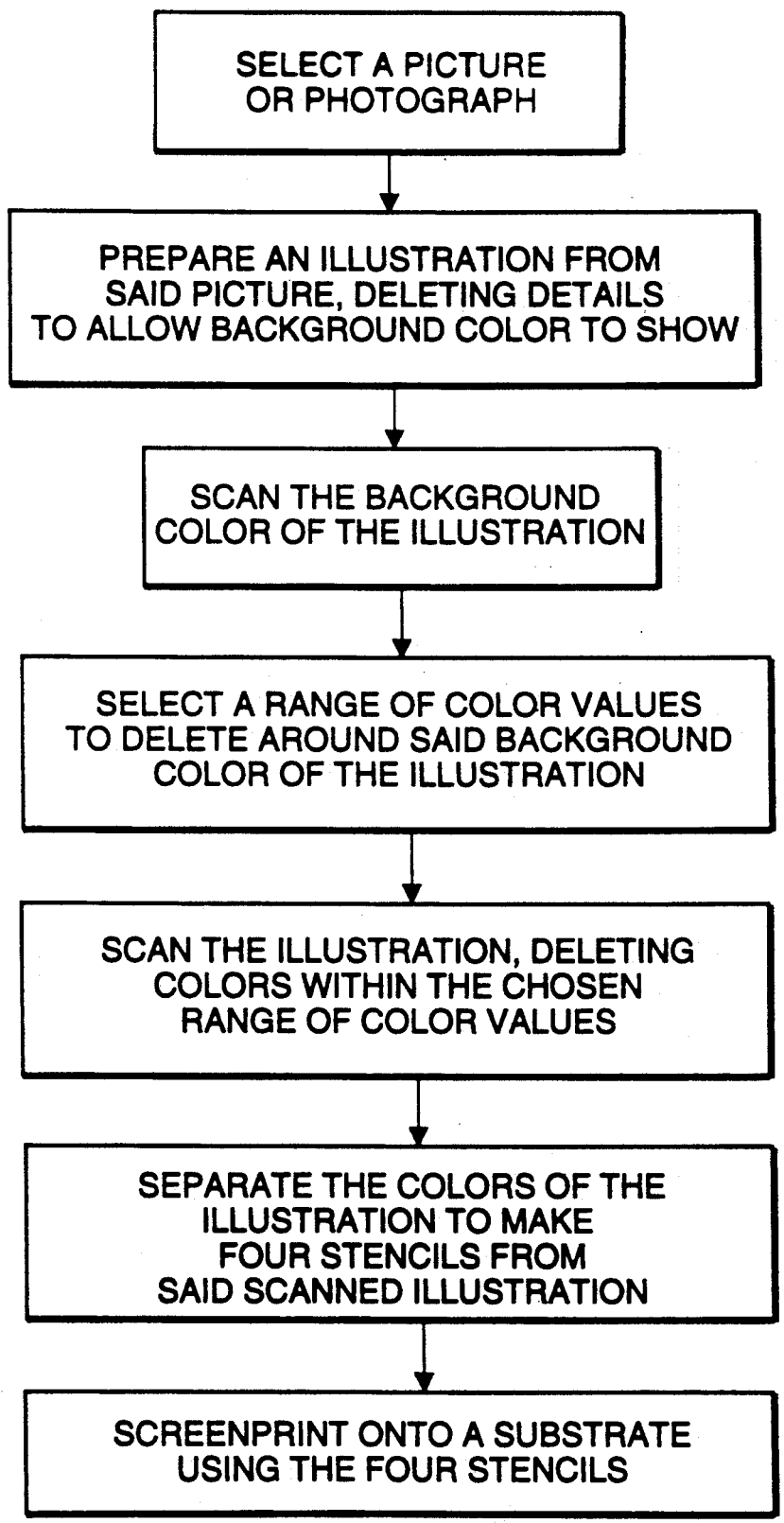

The present invention may be best understood by reference to FIG. 1 which is a flow chart setting forth the steps of the process of the invention that are described in greater detail hereinbelow.

A color photograph or picture having the desired image is chosen. The photograph or picture is then used as the basis for preparing an illustration which will then serve as the basis for the four-color separation. When creating the illustration, the coloring of the illustration is based on the premise that the background color of the substrate upon which the image is printed will be allowed to show through in a large portion of the final decorative object. Additionally, the illustration must also be made with sufficient detailing so as to present the design. For example, if the design is of a person, the details of the face and other distinguishing characteristics must be present. However, a large portion of the area of the object, in the range of about 20-80% of the area of the substrate, will be left blank in the illustration so that after printing, the substrate will be seen in the final object. Hence, smaller details of the design object are deleted in the illustration.

As a first step in the printing process, once the illustration has been prepared, the illustration is scanned by a precision four color processor used in the print art. While the processor may be a standard scanner known in the art, the software controlling the processor must be adjusted in such a way that colors closely related to the color of the substrate that will be used are deleted. This is accomplished by reading the color that is to be deleted with the color densimeter, obtaining a value for that color and picking a suitable range of color values around the value of the deleted color, that will also be deleted. One skilled in the art may accomplish this with minimal experimentation by compressing the tonal range to eliminate the colors close in appearance to the color to be deleted. These deletions will leave blanks in the four stencils produced by the separator, where the color is close to the background color, in addition to those areas left blank by the illustrator. The blanks should result in 20-80% of the surface area of the substrate, that is not printed on. More preferably, the blank area of the substrate ranges from about 40-60% of the surface area.

Once the color separation has been completed, the image is then screen printed onto a suitable substrate. While any screen printing device may be used in the process, a preferred screen printer is one known as a four-color in-line UV screen press, such as was disclosed in U.S. Pat. No. 4,903,592. This type of screen press allows for the printing of all four colors on the substrate with a constant vacuum on the substrate. Moreover, the use of such a screen printer prevents the substrate from excessive movement or vibration during the printing process, such that greater accuracy and clarity of the image may be accomplished.

The substrate used in the process of this invention may be any substrate to which the UV inks used in the process will adhere. It is preferred that the substrate be one that is soft and glossy, so as to impart a good effect, i.e., that of appearing three dimensional, to the final product. A preferred substrate is polyvinylchloride with plasticizers added up to 45 weight percent.

For printing, the stencils are first inserted in the press, after which the substrate is fed into the press. The ink is then laid down on the substrate through the stencils so as to produce the image on the substrate. After application of each of the inks, the ink is allowed to set and dry before the next color ink is laid down. Each ink application, followed by drying, is repeated until all four color inks have been applied. After a final drying, the substrate, with the design printed thereon, may then be cut as desired so as to produce the decorative design article of the present invention, e.g., a human shape for a silhouette or a triangular shape for a pennant, etc.

The present invention is further illustrated by the following specific example which is not intended in any way to limit the scope of the invention.

EXAMPLE

Dan Marino Silhouette—An illustration was prepared from a photograph of a sports figure, Dan Marino of the Miami Dolphins football team. The drawing illustration of Dan Marino was created with the intent to put it on a white background, in order to simulate the white background of a Miami Dolphins uniform. Various details of the design's subject body were deleted in the illustration so as to maximize the blank area. However, sufficient definition remained, so that the figure in the illustration was recognizable as Dan Marino.

The illustration so prepared was then scanned by a customized 70 Line Scan to produce the four-color preparation, which produced a high percentage of open print area. When scanning the illustration, the scanner was programmed to ignore colors near white, which was the color of the substrate background upon which the design was to be printed. Four Ulano 469 Direct Emulsion screw stencils were produced after the preparation of the four color separation by the scanner.

For the screen printing, a precision processor model HPP3545 four-color in-Line UV Screen Press was used. The process was initiated by placing the stencils into the press. The plain weave mesh used in the printing had a 390 line count and was made of low elongation monofilament polyester. The squeegee used in the printing was a special dual durometer 90 Print Side with 60 Support Side. The screen frame used was a Newman Adjustable Roller Model M6A. The inks used in the printing were ultra violet cured Colonial Ink Corporation D40 Process Colors. Two gallons of ink were used in total for a run of 2,500 35'×45' substrate sheets. This was a very light amount, because such a large percentage (about 50%) of the substrate was not printed upon.

The substrate used for preparing the Dan Marino silhouette was a 22 gauge polyvinyl chloride (PVC) film with plasticizers added at 45 weight percent. This is a relatively thick, soft and glossy plastic. The PVC had been dyed white. The PVC was fed into the press and the image was printed in four stages with four different colors being printed through their respective stencils that had been previously produced by the scanner. After each printing, the ink was allowed to dry before applying another layer of ink.

Once the printing was accomplished, the PVC was die-cut so as to produce a silhouette in the shape of Dan Marino, as he had posed for the original photograph.

We claim:

1. A process for preparing a decorative design or image printed on a substrate that may be formed into souvenir-type articles that have a three-dimensional look comprising:
   (a) obtaining a photograph or other picture of the design to be printed;
   (b) preparing from said photograph or picture an illustration of the subject of the picture, said subject having deleted therefrom details such that when an image prepared from said illustration is printed on a substrate portions of the substrate will not be printed on, but containing sufficient detail of the subject such that the subject of the picture is still distinguishable as such;
   (c) obtaining a color value for a chosen background color of the substrate;
   (d) selecting a range of color values including the value of the background color that is to be deleted from the illustration so as to impart a three dimensional effect to the non-deleted portions of the illustration when printed on the substrate;
   (e) scanning said illustration to effect a four-color separation in a fashion such that colors within said selected range of color values are not scanned;
   (f) creating a screen printing stencil from said four-color separation through which the design or image may be screen printed onto a suitable substrate having the chosen background color;
   (g) screen-printing said design or image onto a suitable substrate such that the design or image printed on said substrate has a three-dimensional appearance.

2. A process according to claim 1, where the substrate is polyvinyl chloride.

3. A process according to claim 1, where the image covers 20-80% of the surface area of the printed side of the substrate after it is cut to its final shape.

4. A process according to claim 1, where the image covers 40-60% of the surface area of the printed side of the substrate after it is cut to its final shape.

* * * * *